(12) United States Patent
Ahmad et al.

(10) Patent No.: US 6,728,104 B1
(45) Date of Patent: Apr. 27, 2004

(54) METHODS AND APPARATUS FOR COOLING A CIRCUIT BOARD COMPONENT

(75) Inventors: Mudasir Ahmad, Santa Clara, CA (US); Susheela Narasimhan, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/278,264

(22) Filed: Oct. 23, 2002

(51) Int. Cl.[7] .................................................. H05K 7/20
(52) U.S. Cl. ....................... 361/704; 361/707; 361/719; 174/16.3; 165/80.3; 165/185
(58) Field of Search ................................ 361/688–690, 361/704, 707, 713, 714, 719, 720; 174/16.1, 16.3, 252; 164/80.3, 104.33

(56) References Cited

U.S. PATENT DOCUMENTS

| | | | |
|---|---|---|---|
| 4,607,685 A | | 8/1986 | Mitchell, Jr. ................ 165/80.3 |
| 5,754,401 A | * | 5/1998 | Saneinejad et al. .......... 361/705 |
| 5,875,545 A | | 3/1999 | DeStefano et al. ............. 29/840 |
| 5,991,155 A | * | 11/1999 | Kobayashi et al. .......... 361/705 |
| 6,025,991 A | * | 2/2000 | Saito ............................. 361/704 |
| 6,025,992 A | * | 2/2000 | Dodge et al. ................ 361/704 |
| 6,034,874 A | * | 3/2000 | Watanabe .................... 361/704 |
| 6,049,469 A | * | 4/2000 | Hood et al. .................. 361/818 |
| 6,198,630 B1 | | 3/2001 | Cromwell .................... 361/704 |
| 6,205,025 B1 | * | 3/2001 | Chen ........................... 361/704 |
| 6,293,331 B1 | | 9/2001 | Wang ........................ 165/80.3 |
| 6,315,038 B1 | | 11/2001 | Chiu .......................... 165/185 |
| 6,430,052 B1 | | 8/2002 | Kordes et al. ............... 361/719 |
| 6,545,871 B1 | * | 4/2003 | Ramspacher et al. ........ 361/709 |

OTHER PUBLICATIONS

TCM Thermal Reticle 32262, Research Disclosure, Feb. 1991, No. 322, Kenneth Mason Publications Ltd., England, 1 Page.
Assembled Heat Sinks Folded Assemblies, Sep. 20, 2002, http://www.aavidthermalloy.com/products/foldedfin/index-.shtml, 2 Pages.

\* cited by examiner

Primary Examiner—Boris Chervinsky
(74) Attorney, Agent, or Firm—Chapin & Huang, L.L.C.; David E. Huang, Esq.

(57) ABSTRACT

The heat sink of the present invention includes a device portion, a bend portion, and a support portion that thermally couples the circuit board component to a support member, thereby allowing for heat transfer from the circuit board component to the support member. The bend portion of the heat sink allows for displacement of the device portion relative to the support portion to limit the amount of stress generated by the heat sink on the circuit board component. The geometry of the heat sink further allows placement of the heat sink within the relatively narrow space conventionally formed between the circuit board and the support member.

25 Claims, 6 Drawing Sheets

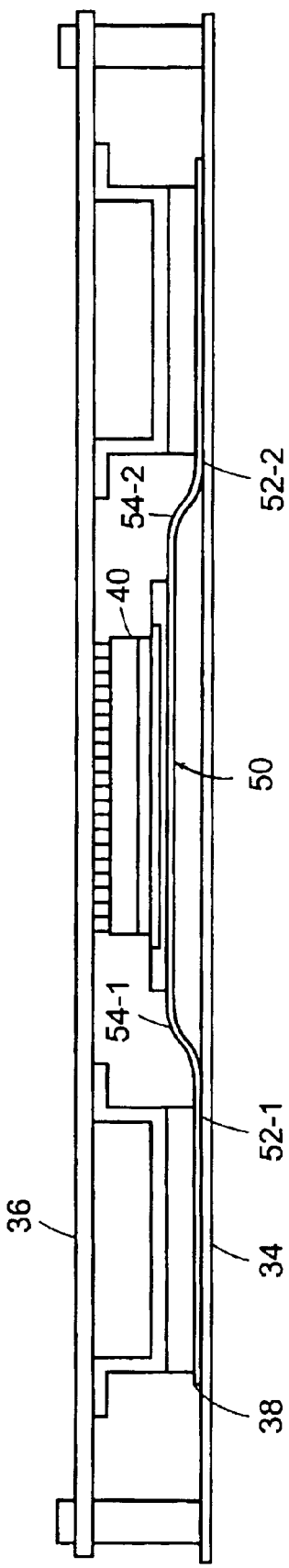
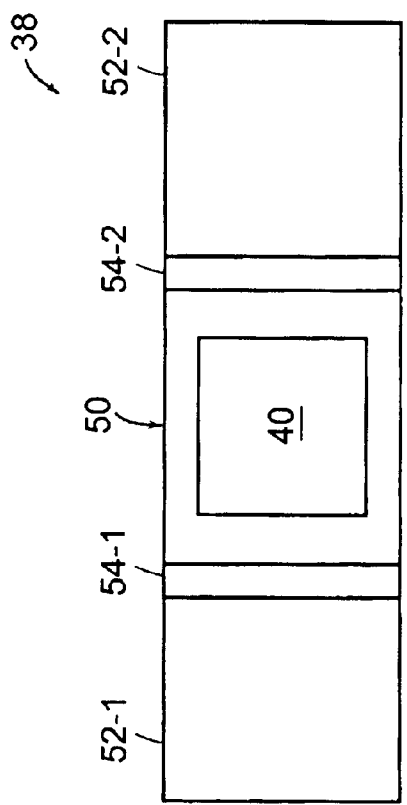
FIG. 7
FIG. 8

METHODS AND APPARATUS FOR COOLING A CIRCUIT BOARD COMPONENT

BACKGROUND OF THE INVENTION

A typical circuit board includes a section of circuit board material (e.g., fiberglass, copper, vias, etc.) and circuit board components attached or mounted to the section of circuit board material. Examples of circuit board components include integrated circuits (ICs), resistors, and inductors. Typically, these circuit board components generate heat during operation. A fan assembly typically generates an air stream that passes over the components to conducts the heat away from the components. The air stream removes the heat so that the components do not operate in an unsafe (e.g., relatively high) temperature range that causes the components to operate improperly (e.g., generate a signal incorrectly) or sustain damage (e.g., overheat, burnout, etc.).

Some ICs include heat sinks to facilitate cooling. In general, a heat sink is a flanged metallic device that attaches directly to the package of the IC. As the IC generates heat, heat flows from the IC package to the heat sink, and dissipates into the surrounding air. The air stream generated by the fan assembly then carries the heat away thus cooling the IC.

Conventional circuit boards utilize a relatively large number of components that encompass a given amount of surface area or real estate on a component side of the circuit board. As the number of components on the circuit board increase, the amount of real estate available for traces (e.g., electronic connections among the components) decreases. Certain circuit boards include relatively larger circuit board components, such as application specific integrated circuits (ASICs), located on a solder side of the circuit board, opposite to the primary, component side of the circuit board. By locating the circuit board components on the solder side of the circuit board, manufacturers increase the amount of surface area or real estate available for traces on the component side of the circuit board.

In order to cool the circuit board component when mounted to the solder side of the circuit board, heat sinks have been conventionally utilized. For example, one such conventional heat sink includes a receptacle that fastens to a support assembly where the support assembly attaches to and supports the circuit board. The heat sink also includes an adjustable member that engages the receptacle and is movable relative to the receptacle in order to control a distance between the adjustable member and the circuit board component. The heat sink can therefore be moved to a position (e.g., in full contact with a circuit board component package, into contact with thermal transfer material that contacts the circuit board component package, etc.) that allows the heat sink to transfer heat from the circuit board component to another structure, such as the support assembly. Such heat transfer allows cooling of the circuit board component during operation even when the component resides in a location having limited space.

SUMMARY OF THE INVENTION

Embodiments of the present invention improve upon the heat sinks of the prior art and provide mechanisms and techniques for cooling a circuit board component mounted to a circuit board. The heat sink of the present invention includes a device portion, a bend portion, and a support portion that thermally couples the circuit board component to a support member, thereby allowing for heat transfer from the circuit board component to the support member. The bend portion of the heat sink allows for displacement of the device portion relative to the support portion to limit the amount of stress generated by the heat sink on the circuit board component. The geometry of the heat sink further allows placement of the heat sink within the relatively narrow space conventionally formed between the circuit board and the support member.

In one embodiment, the invention relates to a heat sink assembly configured to cool a circuit board component mounted to a circuit board. The heat sink includes a device portion configured to thermally contact the circuit board component where the device portion defines a first plane. The heat sink further includes at least one support portion integrally formed with the device portion and in communication with a support member where the at least one support portion defines a second plane substantially parallel to the first plane defined by the device portion. The heat sink also includes a bend portion integrally formed between the device portion and the at least one support portion where the bend portion allows for displacement of the device portion relative to the at least one support portion and controls a stress generated by the device portion on the circuit board component when the support member couples to the circuit board.

The heat sink of the present invention improves over the heat sinks of the prior art in that the present heat sink is formed as a single component, rather than from multiple components. The use of a single component heat sink rather than a multiple component heat sink can reduce manufacturing costs. Furthermore, the geometry of the heat sink (e.g., the device portion, bend portion, and support portion) improves upon the heat sink of the prior art by limiting the amount of stress induced by the heat sink on the circuit board component, thereby limiting damage to the circuit board component caused by the heat sink.

In another embodiment, the heat sink assembly includes a loading portion located between the circuit board and the support member and contacting the at least one support portion. The loading portion generates a load on the support portion, thereby securing the support portion to a surface of the support member. The loading portion improves over the prior art by coupling the support portion of the heat sink to a surface of the support member by a compression force, rather than coupling the heat sink to the support member through holes formed in the support member. The loading portion eliminates the need for creating openings or holes within the support member to secure the heat sink to the support member, thereby reducing manufacturing costs.

In another embodiment, the heat sink assembly includes at least one retainer in communication with both the device portion and the circuit board component each retainer secures the device portion to the circuit board component. In certain cases, manufacturers use thermal adhesive between the circuit board component and the heat sink where the thermal adhesive has relatively high thermal transfer characteristics but relatively low adhesion characteristics. To limit the possibility of disassociation of the heat sink and circuit board component caused by failure of the adhesive the assembler uses the retainer to secure the device portion to the circuit board component.

In another embodiment, the heat sink assembly defines a width between the plane defined by the device portion and the plane defined by the at least one support portion where the width is substantially between a range of 0.55 mm to 2.05 mm. The width of the heat sink further allows placement of the heat sink within the relatively narrow space conventionally formed between the circuit board component and the support member.

In another embodiment, the bend portion of the heat sink defines a bend length where the bend length limiting plastic deformation of the heat sink when the support member couples to the circuit board. If the heat sink were to plastically or permanently deform, the loads generated between the device portion of the heat sink and the circuit board component could be reduced, thereby reducing thermal contact between the device portion and circuit board component. By limiting plastic deformation of the heat sink, the bend length maintains loads generated between the circuit board component and the device portion of the heat sink, thereby maintaining thermal contact between the component and the heat sink.

The features of the invention, as described above, may be employed in electronic equipment and methods such as those of Cisco Systems of San Jose, Calif.

BRIEF DESCRIPTION OF THE DRAWINGS

The foregoing and other objects, features and advantages of the invention will be apparent from the following more particular description of embodiments of the invention, as illustrated in the accompanying drawings and figures in which like reference characters refer to the same parts throughout the different views. The drawings are not necessarily to scale, with emphasis instead being placed upon illustrating the embodiments, principles and concepts of the invention.

FIG. 7 illustrates a side view of a heat sink assembly, according to another embodiment of the invention.

FIG. 8 illustrates a top view of the heat sink assembly of FIG. 7, according to one embodiment of the invention.

DETAILED DESCRIPTION

The heat sink of the present invention includes a device portion, a bend portion, and a support portion that thermally couples the circuit board component to a support member, thereby allowing for heat transfer from the circuit board component to the support member. The bend portion of the heat sink allows for displacement of the device portion relative to the support portion to limit the amount of stress generated by the heat sink on the circuit board component. The geometry of the heat sink further allows placement of the heat sink within the relatively narrow space conventionally formed between the circuit board and the support member.

Figure 1:
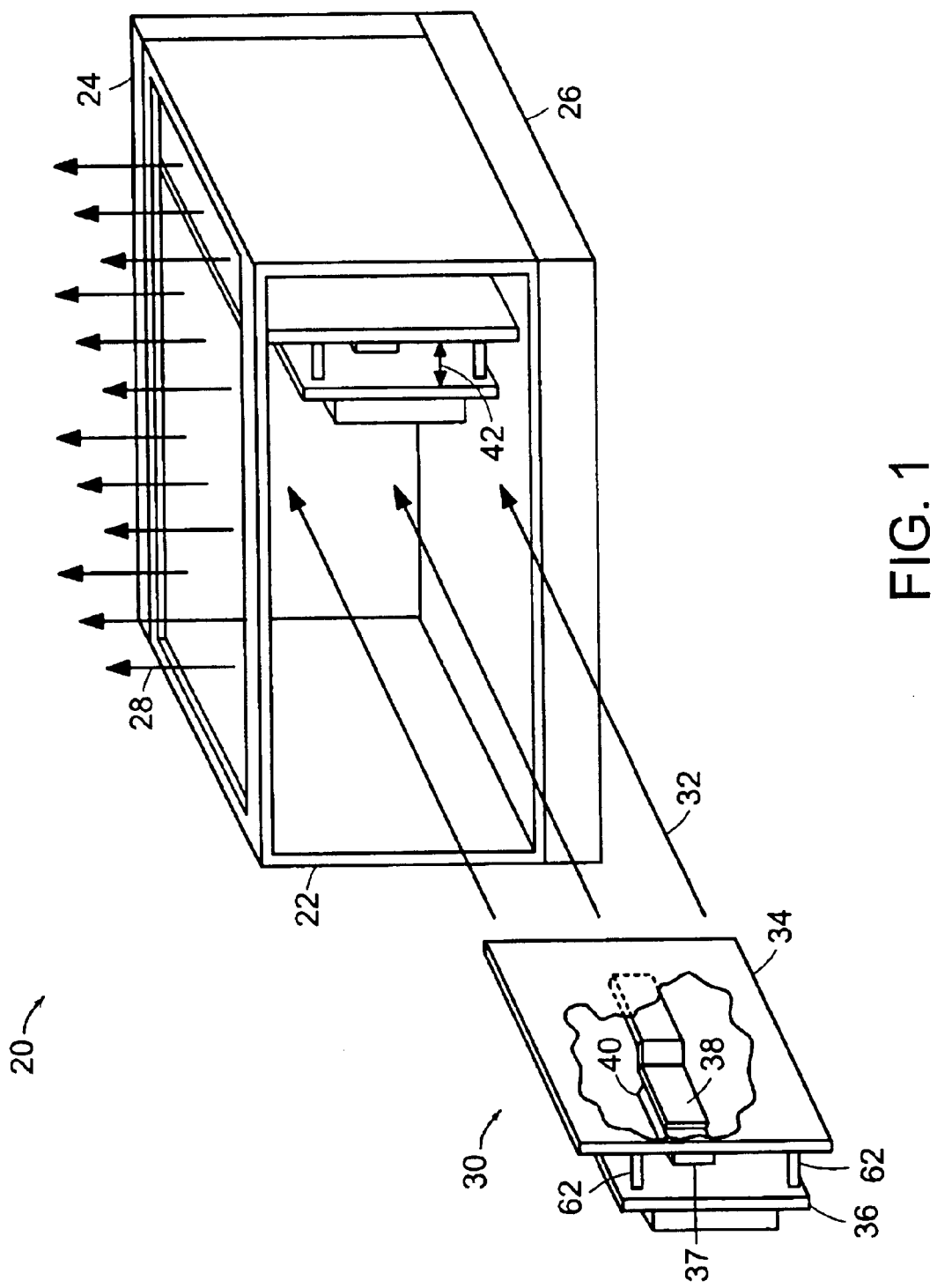
FIG. 1 is a perspective view of a computer system that is suitable for use by the invention.

FIG. 1 shows a computer system 20, suitable for use by the invention. The computer system 20 includes a card cage 22, a back plane 24, and a fan assembly 26 that provides an air stream 28 that flows through the card cage 22. The system 20 further includes multiple circuit board assemblies 30 which connect with the back plane 24 when installed in the card cage 22 in the direction 32.

Each circuit board assembly 30 includes a support member 34, a circuit board 36 including a section of circuit board material 37, a circuit board component 40 mounted to the section of circuit board material 37, and a heat sink 38. In one embodiment, the circuit board 36 coupled to the support member 34 defines a space 42 between the circuit board 36 and the support member 34. For example, the defined space 42 has a length between approximately 5 mm and 7 mm. The circuit board component 40 is mounted to a surface 44 of the circuit board 36 (e.g., solder surface) and is oriented between the circuit board 36 and the support member 34 within the defined space 42 between the circuit board 36 and the support member 34.

In one arrangement, each support member 34 includes side portions 62 that attach the circuit board 36 to the support member 34. Each support member 34 essentially operates as a carrier for holding the circuit board 36 in place for proper alignment and connection with the back plane 24. In one arrangement, the support member 34 includes a metallic material that shields circuitry of the circuit board assembly 30 from external electromagnetic interference (EMI) sources and that shields external circuitry from EMI generated by the circuitry of the circuit board assembly 30.

The heat sink 38 facilitates cooling of the circuit board component 40 regardless of whether the space 42 between the circuit board 36 and the support member 34 is large enough to support an air stream for adequate cooling of the components 40. For example, suppose that the space 42 between the circuit board 36 and the support member 34 is relatively narrow (e.g., between approximately of 5 mm and 7 mm), the heat sink 38 conveys heat from a circuit board component 40 to the support member 34 in order to cool the component 40. In one arrangement, both the heat sink 38 and support member 34 are made from a material having a relatively high heat absorption characteristics (e.g., metal) so that heat from the circuit board component 40 transfers to the support member 34 through the heat sink 38. The air stream 28 provided by the fan assembly 26 between the support member 34 and the circuit board 36 carries the heat from the heat sink 38 and support member 34 away from the component 40 (e.g., convective cooling) in order to cool the component 40. In one arrangement, the heat sink 38 and the support member 34 include metallic material that forms a continuous metallic plane that operates as an EMI shield or barrier.

Figure 2:
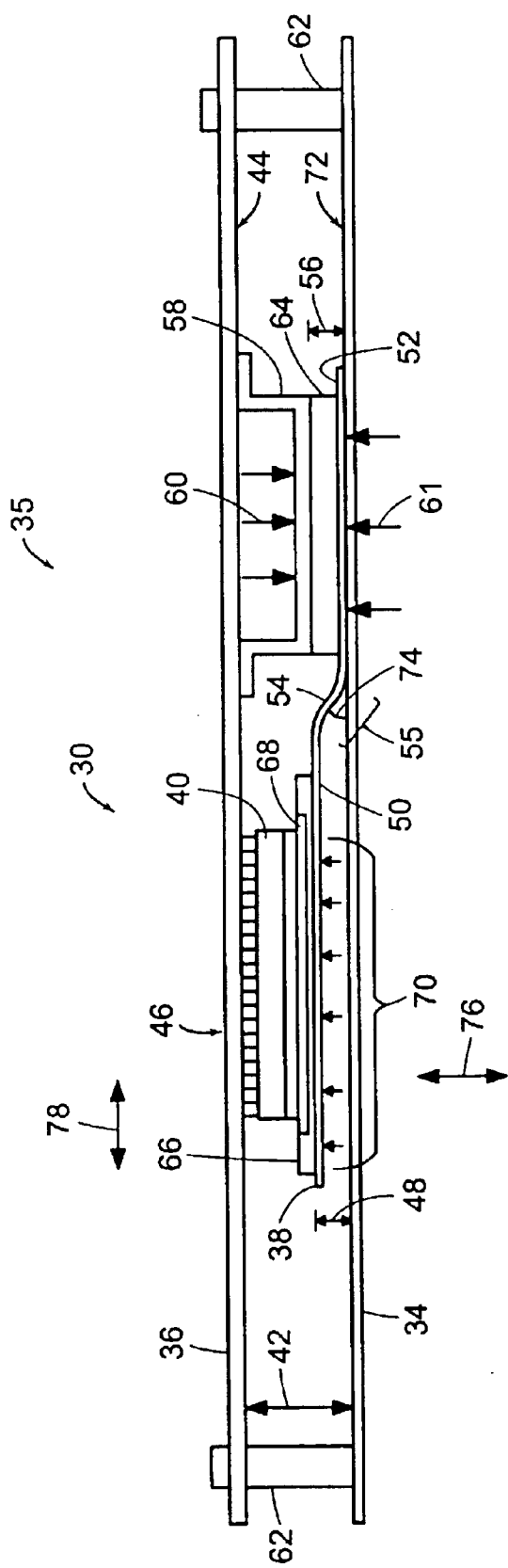
FIG. 2 illustrates a side view of a heat sink assembly, according to one embodiment of the invention.
Figure 3:
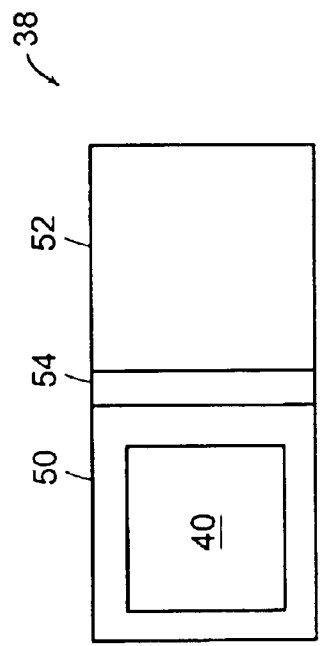
FIG. 3 illustrates a top view of the heat sink of FIG. 1, according to one embodiment of the invention.

FIGS. 2 and 3 illustrate an embodiment of the heat sink 38. FIG. 2 shows a side view of the heat sink 38 as part of a heat sink assembly 35 and the geometric relationship of the heat sink 38 relative to the circuit board 36 and the support member 34. In this configuration, the airflow 28 from the fan assembly 26 is directed through the space 42 (e.g., perpendicular to the page) so that the circuit board 36 or support member does not block the airflow 28. FIG. 3 illustrates a top view of the heat sink 38 and shows an embodiment of a geometric configuration or positioning of the heat sink 38 relative to the circuit board component 40.

In one embodiment, the heat sink assembly 35 includes a heat sink 38 having a device portion 50, a support portion 52, and a bend portion 54. The heat sink assembly 35 also includes a loading portion or first support 58 that secures the heat sink 38 to the support member or second support 34. The heat sink assembly 35 forms part of the circuit board assembly 30 when coupled between the support member 34 and the circuit board component 40 of the circuit board 36 through side portions 62.

In one embodiment, the heat sink 38 is formed of a single piece of thermally conductive material, such as a copper material. The heat sink 38 material is a relatively thin strip of material that can be bent or pressed into a geometry to creates the device portion 50, support portion 52, and bend portion 54 of the heat sink 38. In such a case, the device portion 50, support portion 52, and bend portion 54 of the heat sink 38 are integrally formed from the single piece of material.

In conventional circuit board assemblies 30, the circuit board component 40 and the support member 34 define a space 48 between the circuit board component 40 and the support member 34 of approximately 0.55 mm and 2.05 mm. In order to provide a thermal contact between the circuit board component 40 and the support member 34 and in order to fit within the space 48, the heat sink 38 defines a width 56 between a plane defined by the device portion 50 and a plane defined by the support portion 52. In one embodiment, the width 56 of the heat sink 38 is substantially within a range from 0.55 mm to 2.05 mm.

The relative geometry of the device portion 50, bend portion 54, and support portion 52 allows for motion between the device 50 and bend 54 portions and the support portion 52. Such geometry allows for deformation of the device portion 50 and bend portion 54 relative to the support portion 52 when the circuit board 36 and support member 34 compress the heat sink 38 after assembly. For example, the device portion 50 defines a first plane of the heat sink 38 while the support portion 52 defines a second plane of the heat sink 38, the second plane being substantially parallel to the first plane defined by the device portion 50. Such an arrangement allows the device portion 50 to act as a cantilever relative to the support portion 52, thereby allowing for distribution of loads or stresses from the device portion 50 to the bend portion 54 during loading of the heat sink 38.

The device portion 50 of the heat sink 38 thermally contacts the circuit board component 40 attached to the circuit board 36. In one embodiment, the thermal contact includes a direct contact between the circuit board component 40, or a thermal conductor 68 associated with the circuit board component 40, and the device portion 50 of the heat sink 38. In another embodiment, the thermal contact includes an indirect contact between the device portion 50 and the circuit board component 40. For example, in one embodiment, the thermal contact includes contact between the device portion and a thermal adhesive 66 located between the device portion 50 and the circuit board component 40. By thermally contacting the circuit board component 40, the device portion 50 absorbs heat from the circuit board component 40 and transfers the heat to the support portion 52, away from the circuit board component 40 thereby allowing cooling of the component 40.

The support portion 52 is integrally formed with the device portion 50 and is in communication with the support member 34. The support portion 52 receives heat from the device portion 50 and transfers the heat to the support member 34. The support member 34, in turn, dissipates the heat away from the circuit board component 40, thereby allowing cooling of the circuit board component 40. Accordingly, the heat sink thermally couples the device portion 50 to the support member 34, thus utilizing the heat dissipation characteristics of the support member 34.

In one embodiment, the loading portion or first support 58, located between the circuit board 36 and the support portion 34, contacts the support portion 52 and generates a load or first force 60 on a surface of the support portion 52. The load 60 is substantially orthogonal to a surface 44 of the circuit board 36. In response, the support member or second support 34 generates a second force 61 on the support portion 52 of the heat sink 38 in a direction opposite to the first force 60 and substantially orthogonal to the surface of the second support 52. The forces 60, 61 secure the support portion 52 to a surface 72 of the support member 34. The loads 60, 61 generated by the first support 58 and the second support 34 also cause the heat sink 38 to apply a force or a stress 70 against the circuit board component 40. In one embodiment, the loading portion 58 generates approximately 120 pounds per square inch (psi) on the support portion 52 of the heat sink 38, thereby maintaining the heat sink 38 in contact with the circuit board component 40.

The loading portion 58, in one arrangement, is a bracket located between the circuit board 36 and the support member 34. The loading portion 58 can also be formed of a non-conductive material, such as a plastic material, in order to limit electromagnetic interference with the circuit board component 40 or the circuit board 36. In another arrangement, a compressible pad 64 is located between the support portion 52 and the loading portion 58 to distribute the load 60 from the loading portion 58 over a surface of the support portion 52 when the support member 34 couples to the circuit board 36. The pad 64 limits movement of the support portion 52 relative to the loading portion 58, thereby maintaining thermal contact (e.g. coupling) between the circuit board component 40 and the support member 34.

The bend portion 54 of the heat sink 38 is integrally formed between the device portion 50 and the support portion 52. The bend portion 54 allows for displacement of the device portion 50 relative to the support portion 52 when the support member 34 couples to the circuit board 36. The bend portion 54 also controls a stress generated by the device portion 50 on the circuit board component 40 when the support member 34 couples to the circuit board 36.

During the assembly process, for example, an assembler (e.g., a person assembling the circuit board assembly 30) secures the support member 34 to the circuit board 36. Such securing causes the device portion 50 of the heat sink 38 to apply a load or a stress 70 against the circuit board component 40. As the device portion 50 generates a load on the circuit board component 40, the circuit board component 40 generates an opposite force or load on the device portion 50. The opposing forces create a flattening of the bend portion 54 (e.g., a decrease in an angle 74 formed between the bend portion 54 and the surface 72 of the support member 34). Such flattening allows both a lateral translation 78 of the device portion 50 and vertical translation 76 of the device portion 50 relative to the support portion 52. The bend portion 54 therefore allows displacement of the device portion 50 relative to the support portion 52. Because the bend portion 54 flattens during the loading, the bend portion 54 also acts to absorb a portion of the load generated between the device portion 50 and the circuit board component 40, thereby reducing the load per unit area, or stress, of the device portion 50 on the circuit board component 40. In one embodiment, the bend portion 54 limits the stress between the circuit board component and the device portion to less than between approximately 15 and 20 psi.

The bend portion 54 also includes a bend length 55. In one embodiment, the bend length 55 acts to limit or absorb a portion of the stress generated between the circuit board component 40 and the device portion 50, based upon distortion of the bend portion 54 during loading. In another embodiment, the bend length 55 of the bend portion 54 limits plastic, or permanent, deformation of the heat sink 38. For example, in either embodiment, a bend length 55 greater than approximately 1 cm limits the amount of stress generated between the circuit board component 40 and the device portion 50 of the heat sink 38 and maintains deformation of the bend portion 54 within an elastic range (e.g., prevents permanent, plastic deformation of the heat sink 38). By limiting plastic deformation of the heat sink 38, the bend length 55 maintains loads generated between the circuit board component 40 and the device portion 50 of the heat sink 38, thereby maintaining thermal contact between the component 40 and the heat sink 38.

FIG. 2 also illustrates the use of a thermal adhesive layer 66 between the circuit board component 40 and the device portion 50 of the heat sink 38. The thermal adhesive layer 66 secures the circuit board component 40 to the device portion 50 of the heat sink 38 and provides thermal transfer from the circuit board component 40 to the heat sink 38. The thermal layer 66, in one embodiment, maintains thermal contact between the circuit board component 40 and the device portion 50 (e.g., does not fail) when exposed to shear stresses between the circuit board component 40 and the device portion 50. As described, during assembly, the device portion 50 undergoes a lateral translation 78 relative to the support portion 52 of the heat sink 38. Such a lateral translation 78 places a shear stress on the thermal adhesive 66 located between the device portion 50 and the circuit board component 40. For example, loading of the heat sink 38 induces shear stresses on the thermal adhesive 66 within a range of 0.02 to 0.07 MPa. The thermal adhesive layer 66 maintains thermal contact between the circuit board component 40 and the device portion 50 when exposed to such a range of shear stresses.

Figure 4:
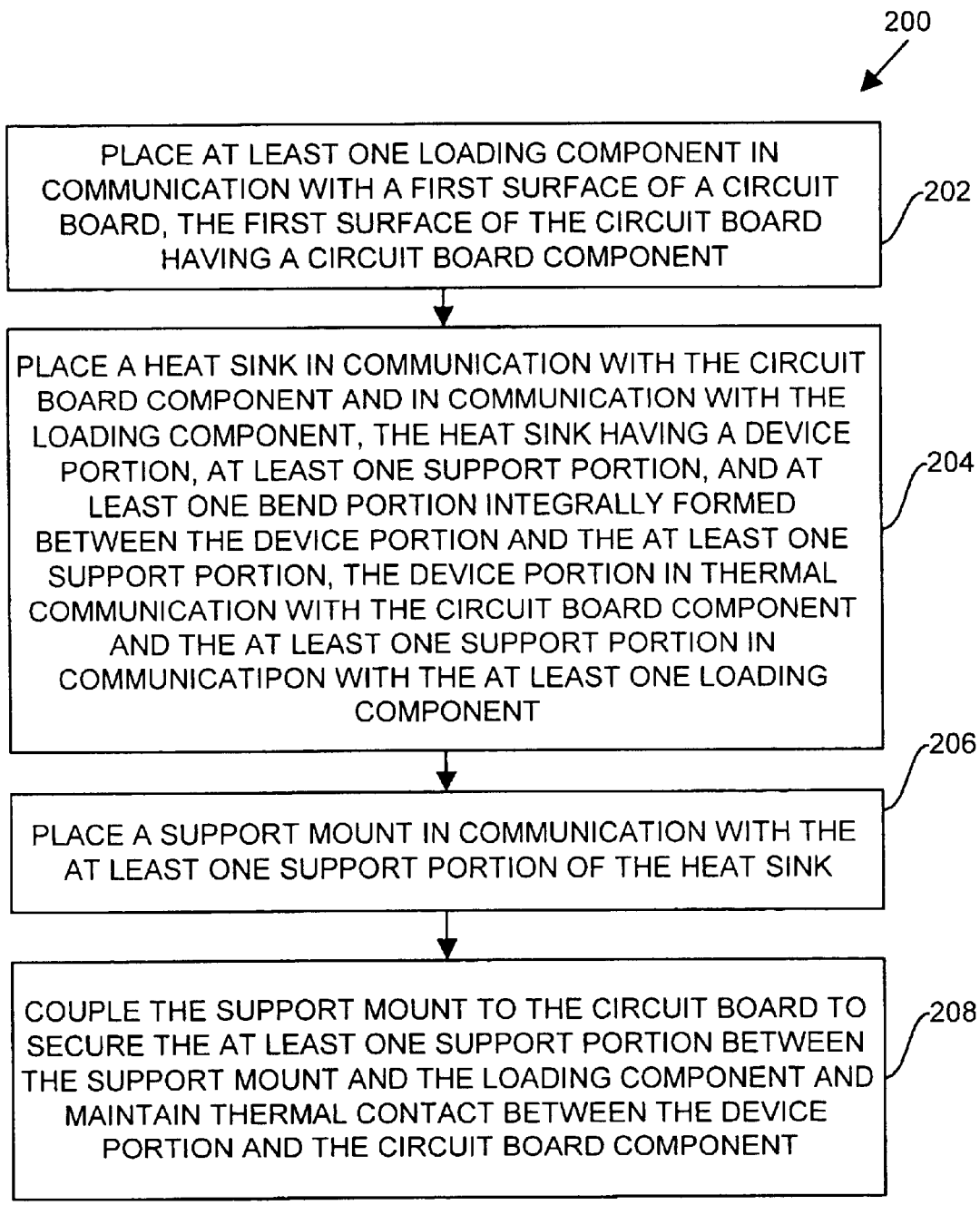
FIG. 4 illustrates a flowchart of a procedure for assembling a heat sink assembly, according to one embodiment of the invention.

FIG. 4 illustrates a flowchart for a method 200 of assembling a heat sink assembly 35. Such a method can be performed either manually (e.g., by a technician on an assembly line) or automatically (e.g., by automated equipment).

In step 202, an assembler places at least one loading component 58 in communication with a first surface 44 of a circuit board 36 where the first surface 44 of the circuit board 36 has a circuit board component 40. The user can secure the loading portion to the surface 44 of the circuit board using an adhesive or solder, for example. In one embodiment, the first surface 44 of the circuit board 36 is a solder surface used for solder attachment of circuit board components placed on a mounting surface 46 of the circuit board 36.

In step 204, the assembler places a heat sink 38 in communication with the circuit board component 40 and in communication with the loading component 58. The heat sink 38 includes a device portion 50, a support portion 52, and a bend portion 54 integrally formed between the device portion 50 and the support portion 52. When placing the heat sink 38 in communication with the circuit board component 40 and in communication with the loading component 58, the assembler places the device portion 50 in thermal communication with the circuit board component 50 and the support portion 52 in communication with the loading component 58. Such communication includes both direct contact (e.g., the device portion 50 physically contacts the circuit board component 40) and indirect contact (e.g., the device portion 50 physically contacts an intermediate layer, such as a thermal adhesive, located between the device portion 50 and the circuit board component 40).

In one embodiment, the assembler places a compressible pad 64 between the loading portion 58 and the support portion 52. The compressible pad 64 acts to distribute a load from the loading portion 58 over a surface of the support portion 52 when the assembler couples the support member 34 to the circuit board 36. Such load distribution limits movement of the support portion 52 relative to the loading portion 58, thereby maintaining thermal contact between the circuit board component 40 and the support member 34.

In step 206, the assembler places a support member 34 in communication with the support portion 52 of the heat sink 38. Such communication includes both direct contact (e.g., the support portion 52 physically contacts the support member 34) and indirect contact (e.g., the support portion 52 physically contacts an intermediate layer located between the support portion 52 and the support member 34). The assembler, in one embodiment, also places the support member 34 in contact with the side portions 62 of the circuit board 36, the side portions 62 being attached to the circuit board 36.

In step 208, the assembler couples the support member 34 to the circuit board 36 in order to secure the support portion 52 between the support member 34 and the loading component 58 and also to maintain thermal contact between the device portion 50 and the circuit board component 40. In one embodiment, the assembler couples the support member 34 to the circuit board 36 by affixing the support member to the side portions 62 of the circuit board 36.

When coupling the support member 34 to the circuit board 36, the assembler causes the support member 34 to generate a load 61 on the support portion 52 of the heat sink 38 and against the loading portion 58. In response, the loading portion 58 generates a load 60 on the support portion 52 and against the support member 34. The generated loads 60, 61 maintain contact between the support portion 52 and the support member 34 and provide for thermal transfer from the circuit board component 40 to the support member 34. The generated loads 60, 61 also create a tight friction fit between the planes of the heat sink 38 and the surfaces 44, 72 of the circuit board 36 and support member 36, respectively.

In one embodiment, during the assembly process, the assembler secures the device portion 50 of the heat sink 38 to the circuit board component 40 using a thermal adhesive 66. While the thermal adhesive 66 secures the heat sink 38 to the circuit board component 40, the thermal adhesive 66 also acts to conduct heat from the circuit board component toward the heat sink 38. Generally, as the adhesive properties of the thermal adhesive 66 increase (e.g., the ability for the adhesive 66 to maintain contact with the heat sink 38), the thermal performance of the thermal adhesive 66 decreases. For circuit board components that generate a relatively large amount of heat (e.g., higher wattage circuit board components 40 components having a wattage requirement of 15–25 W), to provide an optimum amount of heat transfer between the circuit board component 40 and the heat sink 38, an assembler can use a thermal adhesive having a relatively high thermal performance but having relatively low adhesion properties. The assembler, to limit the possibility of disassociation of the heat sink 38 and circuit board component 40 caused by failure of the adhesive 66, in another embodiment, uses a retainer 90 to secure the device portion 50 to the circuit board component 40.

Figure 5:
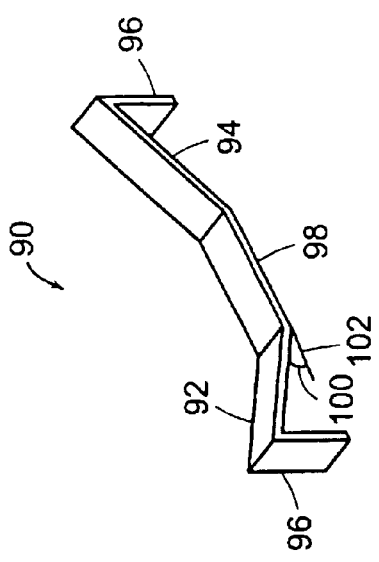
FIG. 5 illustrates a retainer for the heat sink assembly, according to one embodiment of the invention.

FIG. 5 illustrates an embodiment of the retainer 90. The retainer 90 includes a first arm 92 and a second arm 94 each having a clip portion 96. The first arm 92 and a second arm 94 each form an angle 100 relative to a horizontal reference 102 defined by a contact portion 98 of the retainer 90. The angle 100 formed by the first arm 92 and a second arm 94, in one embodiment, creates a spring structure in the retainer 90, thereby causing the retainer 90 to distribute a loading force to the device portion 50 of the heat sink 38 when the retainer 32 engages the circuit board component 40.

Figure 6:
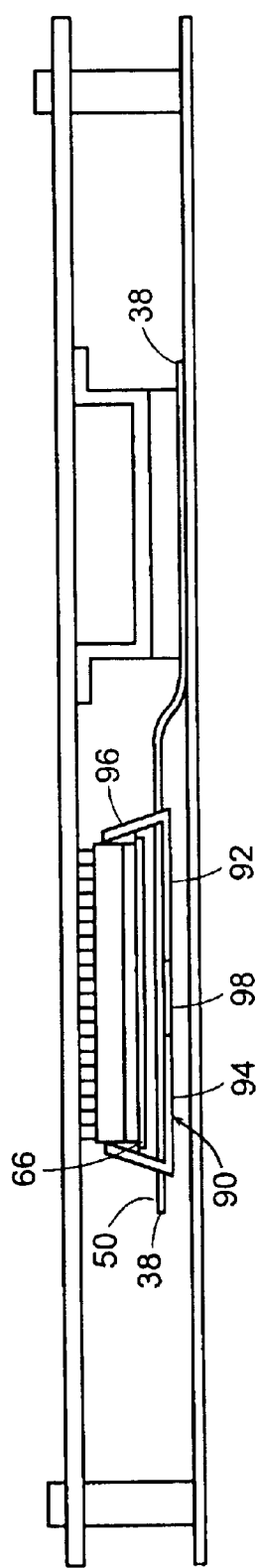
FIG. 6 illustrates the retainer of FIG. 5 coupled to a heat sink assembly, according to one embodiment of the invention.

FIG. 6 illustrates engagement of the retainer 90 with the heat sink 38 and the circuit board component 40. When the retainer 90 engages the circuit board component 40, the clip portions 96 attach to the circuit board component 40 and cause the first and second arms 92, 94 to bend about a contact portion 98 of the retainer 90, thereby decreasing the angle 100 relative to the horizontal reference 102. Such bending of the arms 92, 94 increases the contact area between the arms 92, 94 and the device portion 50 of the heat sink 38 and distributes the forces generated by the retainer 90 over the device portion 50. The distributed load created by the retainer 90, in conjunction with the thermal adhesive 66, maintains the thermal coupling between the device portion 50 of the heat sink 38 and the circuit board component 40.

Those skilled in the art will understand that there can be many variations made to the embodiments explained above while still achieving the same objective of those embodiments and the invention in general.

For example, as described above, the heat sink 38 includes a device portion 50 for receiving heat from a circuit board component and a bend portion 54 and support portion 52 for dispersing heat from the device portion 50 to the support member 34. The use of additional support portions 50 coupled to the device portion 50 can increase the thermal contact between the circuit board component 40 and the support member 34, thereby providing a greater amount of heat transferred form the circuit board component 40 and the support member 34.

FIGS. 7 and 8 illustrate the heat sink 38 as having a first support portion 52-1 and a second support portion 52-2 integrally formed with the device contact portion 50 by respective bend portions 54-1, 54-2. The use of a second support portion 52-2 increases the surface area contact between the heat sink 38 and the circuit board component 40, compared to the heat sink 38 having a single support portion 52. Such an increase in surface area contact thereby provides an increase in the thermal transfer between the circuit board component 40 and the support member 34.

Figure 9:
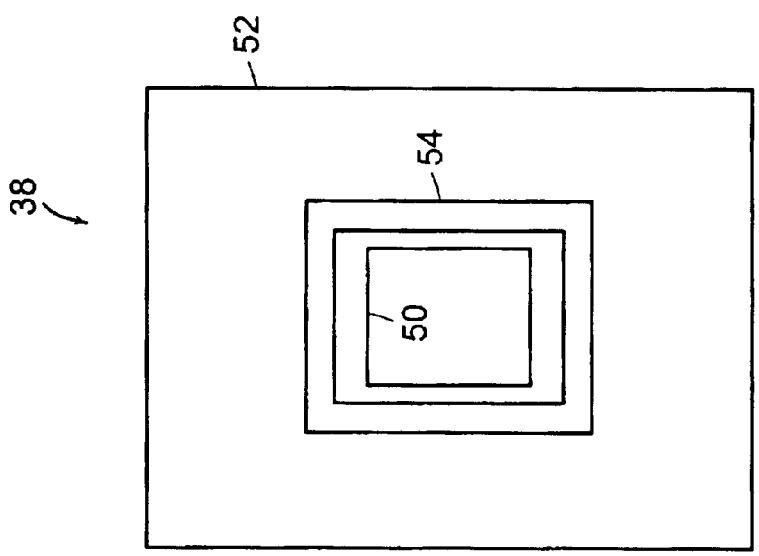
FIG. 9 illustrates a top view of the heat sink assembly according to another embodiment of the invention.

Additionally, greater than two support portions 52-1, 52-2 can be integrally formed with the device portion 50 to further increase the thermal contact between the heat sink 38 and the support member 34. For example, in FIG. 9 a perimeter of the device portion 50 of the heat sink 38 contacts bend portions 54. In turn, the bend portions 54 are integrally formed with a single support portion 52 that follows the perimeter of the device portion 50. Such geometry of the support portion 52 can increase the thermal contact between the heat sink 38 and the support member 34.

Figure 10:
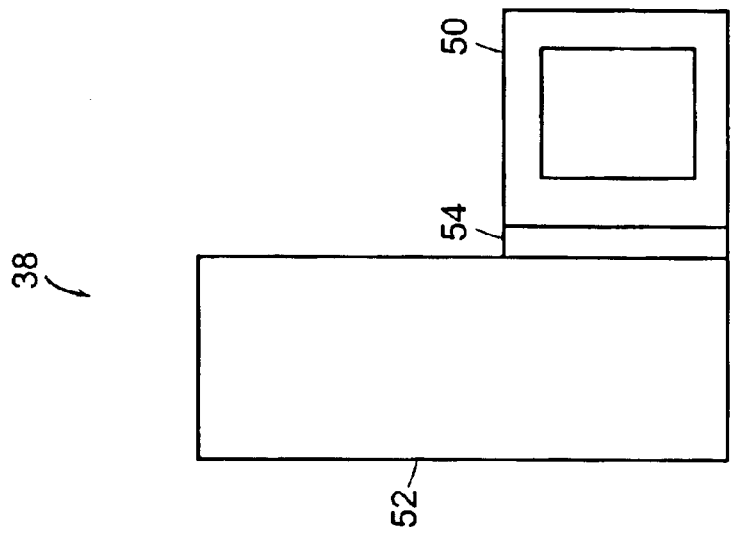
FIG. 10 illustrates a top view of the heat sink assembly according to another embodiment of the invention.

In another example, the heat sink 38 illustrated in FIGS. 1 and 2 is shown as having a generally rectangular shape by way of example only. Heat sinks having varying shapes and performing the same function can also be used. For example, FIG. 10 illustrates a top view of a heat sink 38 having a generally L-shaped configuration. Such alternate geometries allows the heat sink 38 to be used within circuit board assemblies 30 having varying amounts of space for heat sink 38 placement.

Such variations are intended to be covered by the scope of this invention. As such, the foregoing description of embodiments of the invention is not intended to be limiting. Rather, any limitations to the invention are presented in the following claims.

What is claimed is:

1. A heat sink assembly configured to cool a circuit board component mounted to a circuit board, the heat sink assembly comprising:
    a device portion configured to thermally contact the circuit board component, the device portion defining a first plane;
    at least one support portion integrally formed with the device portion and in communication with a support member, the at least one support portion defining a second plane substantially parallel to the first plane defined by the device portion;
    a bend portion integrally formed between the device portion and the at least one support portion, the bend portion allowing for displacement of the device portion relative to the at least one support portion and controlling a stress generated by the device portion on the circuit board component when the support member couples to the circuit board; and
    a loading portion located between the circuit board and the support member and contacting the at least one support portion, the loading portion generating a load on the at least one support portion thereby securing the at least one support portion to a surface of the support member.

2. The heat sink assembly of claim 1 further comprising at least one retainer in communication with both the device portion and the circuit board component, the at least one retainer securing the device portion to the circuit board component.

3. The heat sink assembly of claim 1 defining a width between the plane defined by the device portion and the plane defined by the at least one support portion, the width substantially between a range of 0.55 mm to 2.05 mm.

4. The heat sink assembly of claim 1 wherein the bend portion defines a bend length, the bend length limiting plastic deformation of the heat sink when the support member couples to the circuit board.

5. The heat sink assembly of claim 1 wherein the device portion comprises a thermal adhesive layer configured to thermally contact the circuit board component and secure the heat sink assembly to the circuit board component.

6. The heat sink assembly of claim 1 wherein the bend portion is configured to provide a lateral translation and a vertical translation of the of the device portion relative to the support portion.

7. A circuit board assembly comprising:
    a circuit board including a section of circuit board material;
    a support member coupled to the circuit board, the circuit board and support member defining a space between the circuit board and support member;
    a circuit board component mounted to the section of circuit board material, the circuit board component oriented within the space defined by the circuit board and support member; and
    a heat sink assembly configured to cool the circuit board component mounted to the circuit board, the heat sink assembly including:
        a device portion configured to thermally contact the circuit board component, the device portion defining a first plane, at least one support portion integrally formed with the device portion and in communication with the support member, the at least one support portion defining a second plane substantially parallel to the first plane defined by the device portion, a bend portion integrally formed between the device portion and the at least one support portion, the bend portion allowing for displacement of the device portion relative to the at least one support portion and controlling a stress generated by the device portion on the circuit board component when the support member couples to the circuit board, and a loading portion located between the circuit board and the support member and contacting the at least one support portion, the loading portion generating a load on the at least one support portion thereby securing the at least one support portion to a surface of the support member.

8. The circuit board assembly of claim 7 further comprising at least one retainer in communication with both the device portion and the circuit board component, the at least one retainer securing the device portion to the circuit board component.

9. The circuit board assembly of claim 7 wherein the heat sink assembly defines a width between the plane defined by the device portion and the plane defined by the at least one support portion, the width substantially between a range of 0.55 mm to 2.05 mm.

10. The circuit board assembly of claim 7 wherein the bend portion defines a bend length, the bend length limiting plastic deformation of the heat sink when the support member couples to the circuit board.

11. The circuit board assembly of claim 7 wherein the device portion comprises a thermal adhesive layer configured to thermally contact the circuit board component and secure the heat sink assembly to the circuit board component.

12. The circuit board assembly of claim 7 wherein the bend portion is configured to provide a lateral translation and a vertical translation of the of the device portion relative to the support portion.

13. A method for assembling a circuit board assembly comprising the steps of:

placing at least one loading component in communication with a first surface of a circuit board, the first surface of the circuit board having a circuit board component;

placing a heat sink in communication with the circuit board component and in communication with the loading component, the heat sink having a device portion, at least one support portion, and at least one bend portion integrally formed between the device portion and the at least one support portion, the device portion in thermal communication with the circuit board component and the at least one support portion in communication with the at least one loading component;

placing a support member in communication with the at least one support portion of the heat sink; and coupling the support member to the circuit board to secure the at least one support portion between the support member and the loading component and maintain thermal contact between the device portion and the circuit board component.

14. The method of claim 13 further comprising the step of securing the device portion to the circuit board component using a thermal adhesive.

15. The method of claim 14 further comprising the step of securing the device portion to the circuit board component using at least one retainer in communication with the device portion and with the circuit board component, the at least one retainer coupling the device portion to the circuit board component.

16. The method of claim 13 further comprising the step of placing a compressible pad between the loading portion and the at least one support portion, the compressible pad distributing a load from the loading portion over a surface of the at least one support portion when the support member couples to the circuit board.

17. A heat sink assembly for cooling a circuit board device comprising:

a heat sink; and a set of supports mountable to a circuit board, the set of supports including:
(i) a support member that provides a first force on the heat sink in a direction substantially orthogonal to a surface of the circuit board, and
(ii) a loading portion located between the circuit board and the support member and contacting the heat sink, the loading portion providing a second force on the heat sink in a direction opposite to the first force and substantially orthogonal to a surface of the loading portion, the set of supports causing the heat sink to apply a force against the circuit board device.

18. The heat sink assembly of claim 17 wherein the heat sink comprises:

a device portion configured to thermally contact the circuit board device, the device portion defining a first plane;

at least one support portion integrally formed with the device portion and in communication with the second support, the at least one support portion defining a second plane substantially parallel to the first plane defined by the device portion; and a bend portion integrally formed between the device portion and the at least one support portion, the bend portion allowing for displacement of the device portion relative to the at least one support portion and controlling a stress generated by the device portion on the circuit board device when the support member couples to the circuit board.

19. The heat sink assembly of claim 18 further comprising at least one retainer in communication with both the device portion and the circuit board device, the at least one retainer securing the device portion to the circuit board device.

20. The heat sink assembly of claim 18 defining a width between the plane defined by the device portion and the plane defined by the at least one support portion, the width substantially between a range of 0.55 mm to 2.05 mm.

21. The heat sink assembly of claim 18 wherein the bend portion defines a bend length, the bend length limiting plastic deformation of the heat sink when the support member couples to the circuit board.

22. The heat sink assembly of claim 18 wherein the heat sink comprises a thermal adhesive layer configured to thermally contact the circuit board device and secure the heat sink to the circuit board device.

23. A heat sink assembly configured to cool a circuit board component mounted to a circuit board, the heat sink assembly comprising:

a device portion means for thermally contacting the circuit board component, the device portion means defining a first plane;

at least one support portion means integrally formed with the device portion and in communication with a support member, the at least one support portion means defining a second plane substantially parallel to the first plane defined by the device portion;

a bend portion means, integrally formed between the device portion and the at least one support portion, for allowing displacement of the device portion relative to the at least one support portion and for controlling a stress generated by the device portion on the circuit board component when the support member couples to the circuit board; and a loading portion means located between the circuit board and the support member and contacting the at least one support portion means, the loading portion means generating a load on the at least one support portion means thereby securing the at least one support portion means to a surface of the support member.

24. A heat sink assembly configured to cool a circuit board component mounted to a circuit board, the heat sink assembly comprising:

a device portion configured to thermally contact the circuit board component, the device portion defining a first plane;

at least one support portion integrally formed with the device portion and in communication with a support member, the at least one support portion defining a second plane substantially parallel to the first plane defined by the device portion;

a bend portion integrally formed between the device portion and the at least one support portion, the bend portion allowing for displacement of the device portion relative to the at least one support portion and controlling a stress generated by the device portion on the circuit board component when the support member couples to the circuit board; and at least one retainer in communication with both the device portion and the circuit board component, the at least one retainer securing the device portion to the circuit board component.

25. A circuit board assembly comprising:

a circuit board including a section of circuit board material;

a support member coupled to the circuit board, the circuit board and support member defining a space between the circuit board and support member;

a circuit board component mounted to the section of circuit board material, the circuit board component oriented within the space defined by the circuit board and support member; and a heat sink assembly configured to cool the circuit board component mounted to the circuit board, the heat sink assembly including:

a device portion configured to thermally contact the circuit board component, the device portion defining a first plane, at least one support portion integrally formed with the device portion and in communication with the support member, the at least one support portion defining a second plane substantially parallel to the first plane defined by the device portion, a bend portion integrally formed between the device portion and the at least one support portion, the bend portion allowing for displacement of the device portion relative to the at least one support portion and controlling a stress generated by the device portion on the circuit board component when the support member couples to the circuit board, and at least one retainer in communication with both the device portion and the circuit board component, the at least one retainer securing the device portion to the circuit board component.

* * * * *